United States Patent
Gergel-Hackett et al.

(10) Patent No.: US 9,048,414 B2
(45) Date of Patent: Jun. 2, 2015

(54) NONVOLATILE MEMORY DEVICE AND PROCESSING METHOD

(75) Inventors: Nadine Gergel-Hackett, Germantown, MD (US); Behrang Hamadani, Gaithersburg, MD (US); Curt A. Richter, Olney, MD (US); David James Gundlach, Montgomery Village, MD (US)

(73) Assignee: THE UNITED STATES OF AMERICA, AS REPRESENTED BY THE SECRETARY OF COMMERCE, THE NATIONAL INSTITUTE OF STANDARDS AND TECHNOLOGY, Washington, DC (US)

(*) Notice: Subject to any disclaimer, the term of this patent is extended or adjusted under 35 U.S.C. 154(b) by 1296 days.

(21) Appl. No.: 12/341,059

(22) Filed: Dec. 22, 2008

(65) Prior Publication Data

US 2009/0184397 A1  Jul. 23, 2009

Related U.S. Application Data

(60) Provisional application No. 61/022,534, filed on Jan. 22, 2008.

(51) Int. Cl.
| | |
|---|---|
| *H01L 21/00* | (2006.01) |
| *H01L 45/00* | (2006.01) |
| *H01L 27/10* | (2006.01) |

(52) U.S. Cl.
CPC .............. *H01L 45/08* (2013.01); *H01L 27/101* (2013.01); *H01L 45/1608* (2013.01); *H01L 45/1233* (2013.01); *H01L 45/146* (2013.01)

(58) Field of Classification Search
CPC ... H01L 45/18; H01L 45/146; H01L 45/1233; H01L 45/1608; H01L 27/101
USPC .................. 438/104, 384; 257/536, E21.363, 257/E27.047
See application file for complete search history.

(56) References Cited

U.S. PATENT DOCUMENTS

| | | | | |
|---|---|---|---|---|
| 6,151,241 | A  * | 11/2000 | Hayashi et al. | 365/145 |
| 6,472,073 | B1 * | 10/2002 | Singh et al. | 428/432 |
| 7,302,513 | B2 | 11/2007 | Mouttet | |
| 7,359,888 | B2 | 4/2008 | Snider | |
| 7,420,199 | B2 | 9/2008 | Gutsche | |
| 2003/0207567 | A1 * | 11/2003 | Izumi et al. | 438/678 |
| 2006/0045974 | A1 * | 3/2006 | Campbell et al. | 427/304 |
| 2007/0045752 | A1 * | 3/2007 | Forbes et al. | 257/387 |
| 2007/0200158 | A1 | 8/2007 | Genrikh | |
| 2007/0295950 | A1 * | 12/2007 | Cho et al. | 257/4 |
| 2008/0090337 | A1 | 4/2008 | Williams | |

OTHER PUBLICATIONS

"The Missing Memristor Found", Strukov, et al., 2008 Nature Publishing Group.

* cited by examiner

*Primary Examiner* — Kimberly Rizkallah
*Assistant Examiner* — Maria Ligai
(74) *Attorney, Agent, or Firm* — Carlson, Gaskey & Olds, P.C.

(57) ABSTRACT

A method of processing a nonvolatile memory device includes forming a first electrode, depositing a layer of sol-gel solution on the first electrode, hydrolyzing the layer of sol-gel solution to form a layer of variable electric resistance material, and forming a second electrode on the layer of variable electric resistance material.

2 Claims, 2 Drawing Sheets

NONVOLATILE MEMORY DEVICE AND PROCESSING METHOD

RELATED APPLICATION

This application claims priority to U.S. Provisional Application Ser. No. 61/022,534, which was filed Jan. 22, 2008.

BACKGROUND OF THE INVENTION

This disclosure relates to a processing method compatible with standard and flexible nonvolatile memory devices for use in portable electronic devices, sensors, displays, or the like.

Two-terminal circuit elements may be used as memory devices, or for logic functionality, for example. A two-terminal circuit may include an electrically variable material between two electrodes. Such a circuit element, with a non-linear and time-dependent relationship between the change in current and the change in voltage, may also be known as a memristor.

One type of memristor includes a region of doped titanium dioxide arranged adjacent a region of undoped titanium dioxide. Applying a voltage to the memristor is thought to cause migration of the dopants between the doped and undoped regions that contributes to changing the electric resistance of the memristor.

One problem associated with titanium dioxide memristors is that the processing techniques may be expensive and require relatively tight control of processing parameters. For instance, titanium dioxide memristors may be fabricated using in-vacuo oxidation of titanium, ozone techniques, or sputtering. Typically, such techniques require expensive equipment and may not be suitable for making flexible memory devices. Additionally, the processing parameters, such as times, temperatures, and oxygen levels, must be tightly controlled to achieve the desired doped and undoped regions.

SUMMARY OF THE INVENTION

An exemplary method of processing a nonvolatile memory device includes forming a first electrode, depositing a layer of sol-gel solution on the first electrode, hydrolyzing the layer of sol-gel solution to form a layer of variable electric resistance material, and forming a second electrode on the layer of variable electric resistance material.

In another aspect, an exemplary method of processing a nonvolatile memory device comprising first and second electrodes and a layer of variable electric resistance material between the first and second electrodes includes the step of forming the layer of variable electric resistance material from a solution.

An exemplary nonvolatile memory device includes a flexible substrate, first and second electrodes on the flexible substrate, and a layer of variable electric resistance material between the first and second electrodes.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
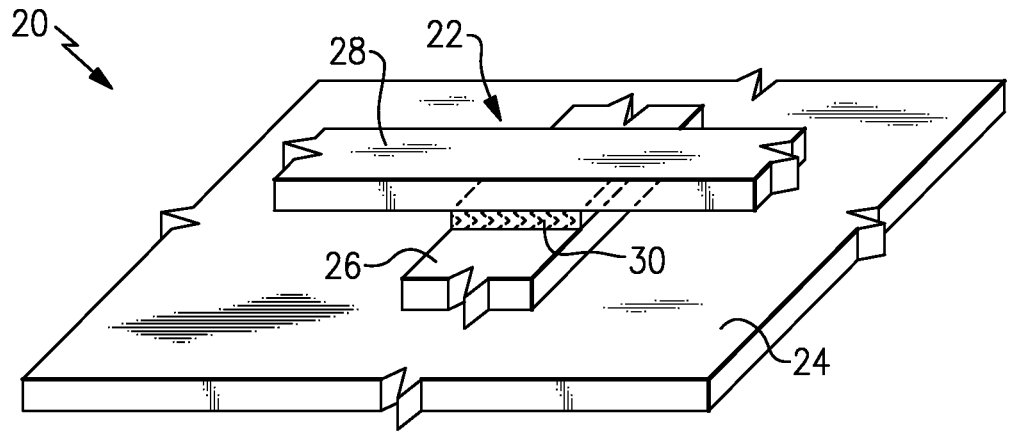
FIG. 1 illustrates an example nonvolatile memory device.

FIG. 1 schematically illustrates selected portions of an example nonvolatile memory device 20. For instance, the nonvolatile memory device 20 may be used in portable electronic devices, sensors, displays or the like but is not limited to any particular type of device. Although a particular arrangement for the nonvolatile memory device 20 is shown in this example, it is to be understood that this disclosure may be applied to other configurations or other electrical devices.

In this example, the nonvolatile memory device 20 includes an electric circuit 22 attached to a substrate 24. For instance, the electric circuit 22 may be a crossbar type arrangement that is part of an array of like electric circuits 22. The substrate 24 may be any desired type of substrate for the end use application. In some examples, the substrate 24 may be flexible and the electric circuit 22 may be thin such that the non-volatile memory device 20 as a whole is flexible. For instance, the substrate 24 may include a flexible polymer sheet that is, for example, similar in composition and flexibility to a flexible polymer sheet used for overhead projector transparencies. Alternatively, the substrate 24 may be rigid and inflexible, such as a silicon-based substrate.

The electric circuit 22 includes first and second electrodes 26 and 28, and a layer of variable electric resistance material 30 between the first and second electrodes 26 and 28. In the disclosed example, the first and second electrodes 26 and 28 are aluminum. In other examples, the first and second electrodes 26 and 28 may be gold, platinum, or other type of electrically conductive contact material. The thicknesses of the first and second electrodes 26 and 28 may be selected based on a known end use. In one example, the thickness is less than about 100 nanometers such that the first and second electrodes 26 and 28 are flexible. Given this description, one of ordinary skill in the art will be able to recognize other desirable thicknesses for their particular application.

The layer of variable electric resistance material 30 (e.g., a memristor) is a metal oxide material. In one example, the thickness of the layer of variable electric resistance material 30 is less than about 100 nanometers such that the layer 30 is flexible. In a further example, the thickness is about 50 nanometers. Given this description, one of ordinary skill in the art will be able to recognize other desirable thicknesses for their particular application.

The metal oxide may be titanium oxide ($TiO_x$), such as titanium dioxide. In the case of titanium dioxide, a small amount of $TiO_{2-x}$ may also be present as a result of the processing technique used to form the layer of variable electric resistance material 30, which will be described below. Without being bound by any particular theory, it is thought that the layer of variable electric resistance material 30 includes oxygen vacancies as a result of the processing technique, which contribute to the variable electric resistance properties.

Figure 2:
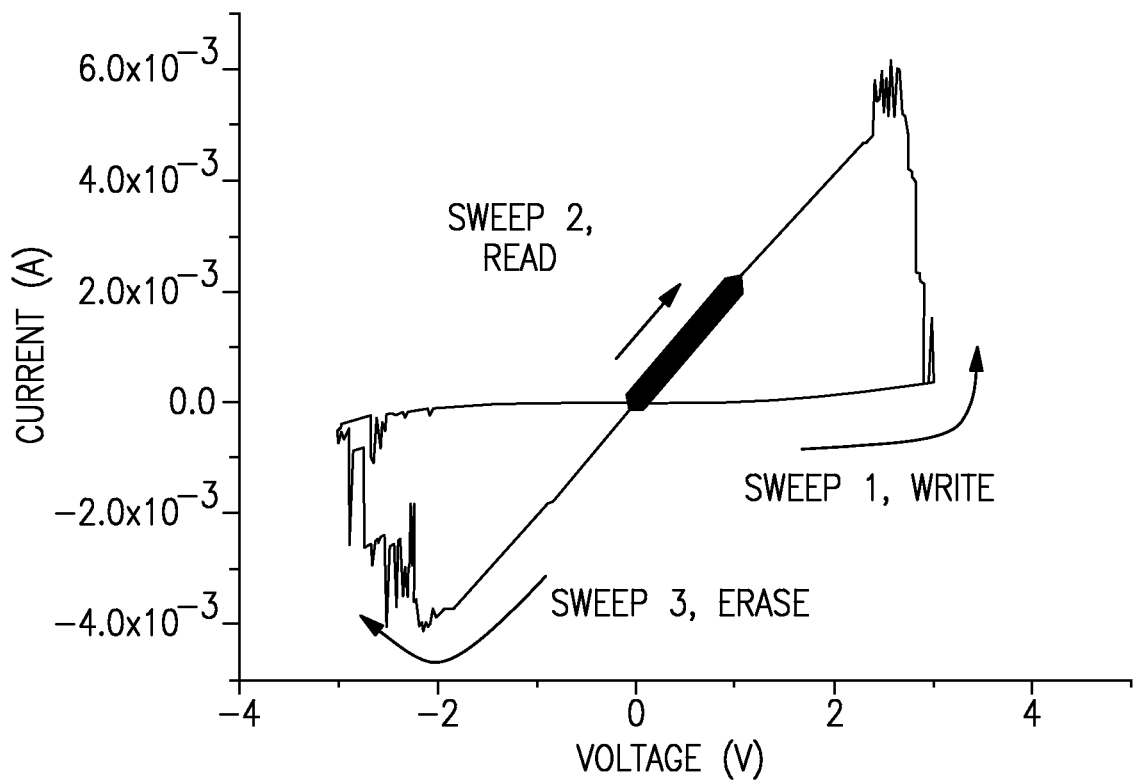
FIG. 2 illustrates an example graph of the variable electric resistance of the nonvolatile memory device.

FIG. 2 illustrates a graph of electric current versus voltage to illustrate an example of the memristor properties of the layer of variable electric resistance material 30 (i.e., varying electric resistance/conductance). As illustrated, the behavior of the variable electric resistance material 30 is consistent with a non-linear and time-dependent relationship between the change in the current and the change in the voltage. The graph illustrates three separate applications of voltage to the layer of variable electric resistance material 30. Although currents and voltages are shown, the actual current and voltage may vary depending on a given application, number of voltage cycles, or thicknesses of the layers, for example.

Initially, the layer of variable electric resistance material 30 is in a high resistivity/low conductivity state. In the first voltage application, the voltage is swept from 0 to approximately 3 volts and back to 0 volts again. At about 3 volts, the layer of variable electric resistance material 30 transitions to a low resistance/high conductivity state, as indicated by the increase in current.

The second voltage application indicates that the layer of variable electric resistance material 30 maintained the low resistance/high conductivity state from the first voltage application, as indicated by a current magnitude that is consistent with the current after the initial 3 V bias was applied. The layer of variable electric resistance material 30 maintains the low resistance/high conductivity state until application of a bias voltage with the opposite polarity of the initial sweep.

The third voltage application represents a sweep from 0 to a negative bias voltage of about −3 volts and then back to 0 again. At about −2 volts, the layer of variable electric resistance material 30 transitions from the low resistance/high conductivity state that resulted from the first voltage application to a high resistance/low conductivity state, as indicated by the sharp decrease in the current to a low current state.

The range of switching threshold voltage magnitudes (i.e., voltages causing transition between low and high resistance states) ranged from about 2 volts to about 10 volts. The range may depend on physical device parameters (e.g. film thickness or contact area), magnitude of applied bias, time bias is applied, and number of consecutive sweeps. Thus, the layer of variable electric resistance material 30 provides the benefit of relatively low power switching (less than 10 volts).

Additionally, the layer of variable electric resistance material 30 also provides a desirable on/off ratio, which refers to the difference in current between the low and high resistance states for a given voltage. For instance, larger ratios may be desired in the non-volatile memory device 20 to more accurately determine whether the layer of variable electric resistance material 30 is in the low or high resistance state. For instance, in the non-volatile memory device 20, the low and high resistance states may correspond to "0" or "1" binaries for storing information. The on/off ratio of the layer of variable electric resistance material 30 may be in a range of about 2:1 to about 10,000:1, depending upon physical device parameters (e.g. film thickness or contact area), magnitude of applied bias, time bias is applied, and number of consecutive sweeps.

In operation, the non-volatile memory device 20 may utilize pulses of voltage across the first and second electrode 26 and 28 as read, write, or erase actions. For instance, a read pulse of voltage on the order of 1 volt or less may be used to determine whether the layer of variable electric resistance material 30 is in a low or high conductivity state. Likewise, pulses of higher voltage may be applied to change the layer of variable electric resistance material 30 between low and high conductivity states as a write or erase action.

Figure 3:
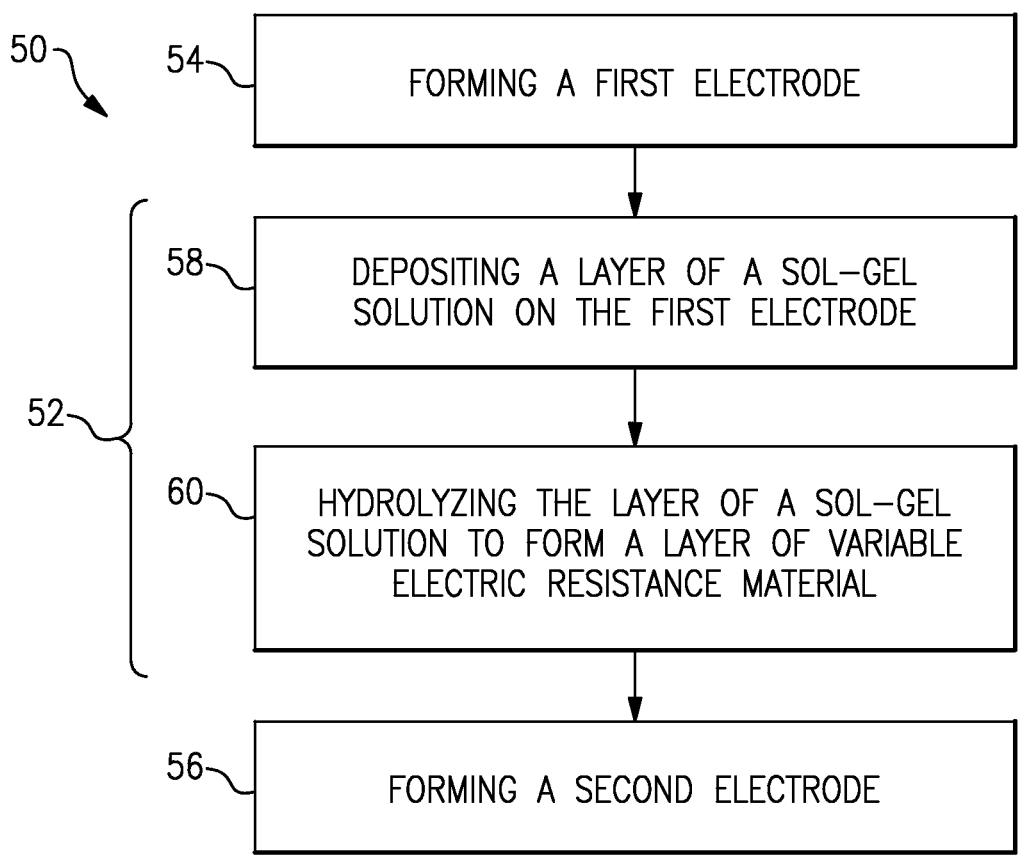
FIG. 3 illustrates an example method of processing the nonvolatile memory device.

FIG. 3 illustrates an example method 50 of processing the nonvolatile memory device 20. The method 50 is a relatively simple, low cost, and low energy technique for fabricating the layer of variable electric resistance material 30 and nonvolatile memory device 20.

The method 50 includes a step 52 of forming the layer of variable electric resistance material 30 from a solution. For instance, the forming step 52 may constitute the entire method 50 or be used with other steps to manufacture the non-volatile memory device 20. For instance, the method 50 may also include steps 54 and 56 of forming, respectively, the first electrode 26 and the second electrode 28. Additionally, the method 50 may be a continuous process performed at a single location or, alternatively, a discontinuous process performed at different locations, for example.

The forming step 52 may include step 58 of depositing a layer of sol-gel solution on the first electrode 26 and step 60 of hydrolyzing the layer of sol-gel solution to form the layer of variable electric resistance material 30. Using the sol-gel solution allows production of the layer of variable electric resistance material 30 at room temperature without the need for vacuum or sputtering operations requiring expensive equipment, or heating the devices to high temperatures. In this disclosure, room temperature is understood to be in the range of about 18° C. (64.4° F.) to 28° C. (82.4° F.). However, the step 52 of forming the layer of variable electric resistance material 30 from a solution is not limited to room temperature and may be conducted in whole or in part at temperatures outside of room temperature. However, using room temperature processing allows use of a polymer material as the substrate 24, such as a flexible polymer sheet. The high temperatures of prior processing techniques would likely damage a polymer substrate.

The sol-gel solution may be prepared from a mixture of a solvent and a precursor of the variable electric resistance material. For instance, the precursor may be a metal alkoxide. In the case of forming titanium dioxide, the precursor is titanium alkoxide. The precursor may be stored in an inert environment, such as an argon gas environment, to limit premature hydrolysis. The solvent, or carrier, may be ethanol but is not limited to any particular solvent. The solvent and the precursor may be mixed together in a known manner to form the sol-gel solution.

The ratio of the amount of solvent to the amount of precursor determines the viscosity of the sol-gel solution. For instance, a relatively low viscosity may be used to provide a relatively thin layer 30, and vice versa. In one example, the sol-gel solution includes about ten parts of the solvent and about one part of the precursor (i.e. 10:1 ratio) to achieve a final thickness (of the layer of variable electric resistance material 30) that is less than about 100 nanometers.

The sol-gel solution may be deposited onto the first electrode 26 and substrate 24 using a spin coating technique. Masking may be used to deposit the sol-gel solution only on desired areas, and the spin coating may be conducted under an inert atmosphere to control premature hydrolysis. For instance, the sol-gel solution may be deposited in a known manner on the first electrode 26 and spun at a predetermined speed for a predetermined amount of time to distribute the sol-gel solution over the desired area of the first electrode 26. The spin coating parameters of speed and time are not limited to any particular values. However, in one example, the speed may be in the range of 1-1000 revolutions per second for a time of about 60 seconds. In another example, the speed may be 10-50 revolutions per second to uniformly distribute the sol-gel solution over the desired area of the first electrode 26 in a desired thickness. The sol-gel could also be deposited using drop casting or ink jet printing methods.

After depositing the sol-gel solution, the hydrolyzing step 60 may include exposing the sol-gel solution to air at room temperature for a predetermined amount of time. For instance, hydrolysis of the sol-gel solution may form a gel (a continuous network with trapped liquid), from which the dispersed liquid (solvent) may or may not evaporate. This gel is the layer of variable electric resistance material 30. The layer of variable electric resistance material 30 is substantially metal oxide from the precursor of the sol-gel solution. However, some of the solvent may remain in the layer 30 after the hydrolysis step 60.

The first and second electrodes 26 and 28 may be deposited in a known manner. For instance, thermal evaporation or other deposition technique may be used to deposit the first and second electrodes 26 and 28 in a desired thickness. The first electrode is formed prior to forming the layer of variable electric resistance material 30, and the second electrode 28 is formed after forming the layer of variable electric resistance material 30.

The layer of variable electric resistance material 30 formed using the disclosed method 50 may also be characterized by an index of refraction of approximately 1.65 and an absorption edge of about 3.5 electron volts (e.g., using spectroscopic ellipsometry). For instance, the disclosed index of refraction is lower than known reported data for sputtered type titanium dioxide films and annealed sol-gel films, which may indicate that other processing techniques are not necessarily suitable for producing the layer of variable electric resistance material 30 with desirable properties for non-volatile memory devices. The lower index of refraction may indicate that the layer 30 is less than dense than sputtered or annealed titanium dioxide films or that the layer 30 contains residual solvent from the processing method 50.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A method of processing a nonvolatile memory device, comprising:
   forming a first electrode;
   depositing a layer of the sol-gel solution on the first electrode;
   hydrolyzing the layer of sol-gel solution to form a gel layer of variable electric resistance material, including depositing the layer of the sol-gel solution and hydrolyzing the layer of the sol-gel solution at room temperature; and
   forming a second electrode on the gel layer of variable electric resistance material.

2. A method of processing a nonvolatile memory device, comprising:
   forming a first electrode;
   depositing a layer of sol-gel solution on the first electrode;
   hydrolyzing the layer of sol-gel solution to form a gel layer of variable electric resistance material, wherein hydrolyzing the layer of the sol-gel solution includes exposing the sol-gel solution to air; and
   forming a second electrode on the gel layer of variable electric resistance material.

* * * * *